United States Patent
Dewan et al.

(10) Patent No.: US 10,305,506 B2
(45) Date of Patent: May 28, 2019

(54) PAD ASYMMETRY COMPENSATION

(71) Applicant: Infineon Technologies AG, Neubiberg (DE)

(72) Inventors: Ketan Dewan, Unterhaching (DE); Reinhard Kussian, Klagenfurt (AT); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 80 days.

(21) Appl. No.: 15/690,728

(22) Filed: Aug. 30, 2017

(65) Prior Publication Data

US 2019/0068214 A1 Feb. 28, 2019

(51) Int. Cl.
*H03M 3/00* (2006.01)

(52) U.S. Cl.
CPC ............. *H03M 3/322* (2013.01); *H03M 3/32* (2013.01); *H03M 3/458* (2013.01)

(58) Field of Classification Search
CPC ......... H03M 3/322; H03M 3/32; H03M 3/458
USPC .................................................. 341/143, 118
See application file for complete search history.

(56) References Cited

U.S. PATENT DOCUMENTS

| 9,106,255 B1* | 8/2015 | Zhang .................... H03M 3/422 |
| 9,537,497 B2* | 1/2017 | Ho ........................... H03M 1/06 |
| 9,577,662 B2* | 2/2017 | Wei ......................... H03M 3/37 |

* cited by examiner

*Primary Examiner* — Brian K Young
(74) *Attorney, Agent, or Firm* — Schiff Hardin LLP

(57) ABSTRACT

A modulator including a delta-sigma modulation circuit having an order greater than 1, and configured to modulate an input signal into a Pulse Density Modulated (PDM) signal; and a Pad Asymmetric Compensation (PAC) circuit configured to linearize a relation between a magnitude of the input signal and a number of rise or fall transitions of the PDM signal by maximizing the number of rise or fall transitions of the PDM signal, and to output a modified PDM signal, wherein the linearized relation is for compensating for any offset in the PDM signal.

20 Claims, 6 Drawing Sheets

| Input | Output | Pulse-density |
|---|---|---|
| $2^{16}$ | 1111111111111111 ... | 100% |
| $2^{15} + 2^{14}$ | 1111110011111100 ... | 75% |
| $2^{15}$ | 1100110011001100 ... | 50% |
| $2^{14}$ | 1100000011000000 ... | 25% |
| 0 | 0000000000000000 ... | 0% |

200

400

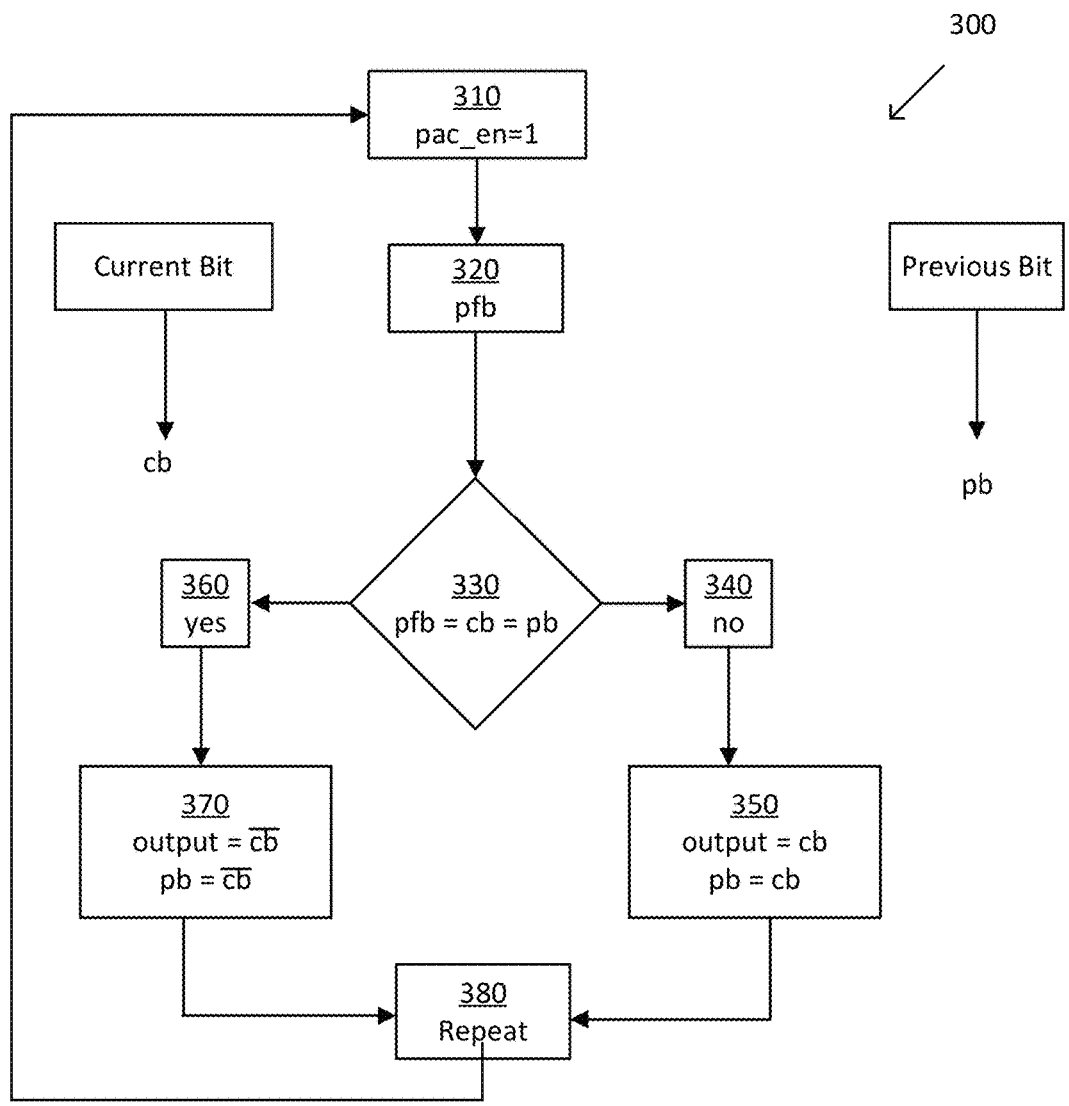

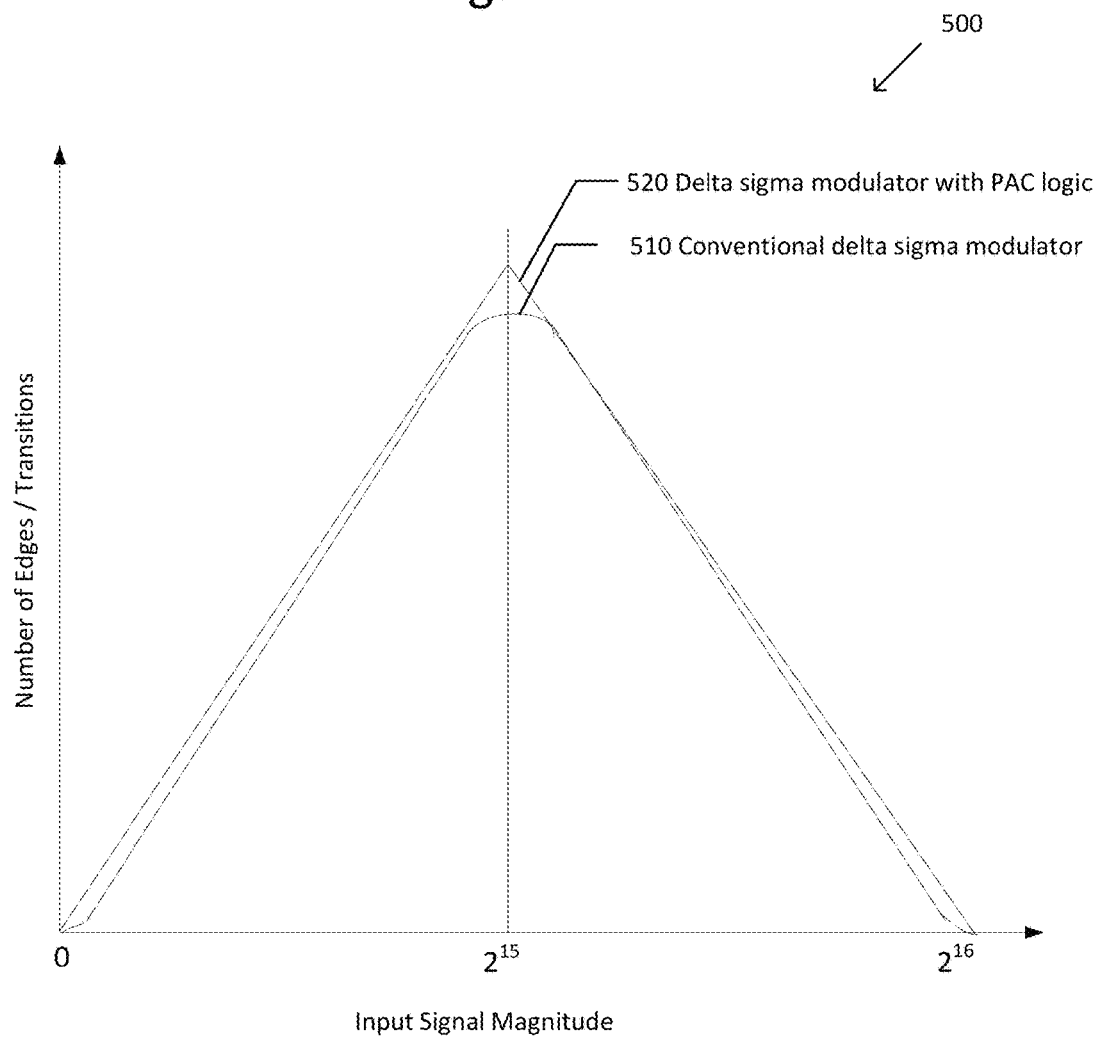

PAD ASYMMETRY COMPENSATION

BACKGROUND

Semiconductor Integrated Circuits (IC) have Input/Output (I/O) pads that may be physically asymmetric, resulting in asymmetry between rise and fall times of passing signals.

FIG. 7 illustrates that in a conventional delta-sigma modulator circuit, when a Pulse-Density Modulated (PDM) signal passes through an asymmetric I/O pad and is demodulated or averaged using a Low Pass Filter (LPF), the asymmetry results in a Direct Current (DC) voltage offset. E1 and E0 represent the pulse widths of a logic 1 and of a logic 0, respectively. If the PDM signal passes through an I/O pad that is symmetric, the PDM signal rise and fall times are equal, and thus there is no DC voltage offset. On the other hand, if the PDM signal passes through an I/O pad that is asymmetric, there is a DC voltage offset, which may be positive or negative depending on the type of asymmetry. More specifically, if the rise time is less than the fall time, the DC voltage offset is positive. And if the rise time is greater than the fall time, the DC voltage offset is negative. DC voltage offset is not compensated for easily.

Conventional approaches for achieving symmetry between rise and fall times have focused on improving I/O pad design. Such approaches are disadvantageous in that they have longer design cycles, more complex pad designs, higher power consumption, larger area, and higher cost.

BRIEF DESCRIPTION OF THE DRAWINGS

FIG. 3 illustrates a flowchart a method performed by a Pad Asymmetric Compensation (PAC) circuit in accordance with aspects of the disclosure.

FIG. 5 illustrates graph of number of edges/transitions versus input magnitude for a conventional DSM and a DSM with PAC logic in accordance with aspects of the disclosure.

DETAILED DESCRIPTION

The present disclosure is directed to a modulator including a delta-sigma modulation circuit having an order greater than 1, and configured to modulate an input signal into a Pulse Density Modulated (PDM) signal, and a Pad Asymmetric Compensation (PAC) circuit configured to linearize a relation between a magnitude of the input signal and a number of rise or fall transitions of the PDM signal by maximizing the number of rise or fall transitions of the PDM signal, and to output a modified PDM signal, wherein the linearized relation is for compensating for any offset in the PDM signal.

In a conventional DSM circuit of an order greater than one, there is a non-linear relation between a magnitude of an analog/digital input signal and a number of transitions or edges of a PDM output signal (i.e., logic 0 to 1, and vice-versa). The PAC circuit disclosed herein is configured to linearize this non-linear relation. Using this linear relation, I/O pad asymmetry may be compensated for by multiplying the input signal, the output PDM signal, or its demodulated signal by a corresponding linear factor.

Figure 1:
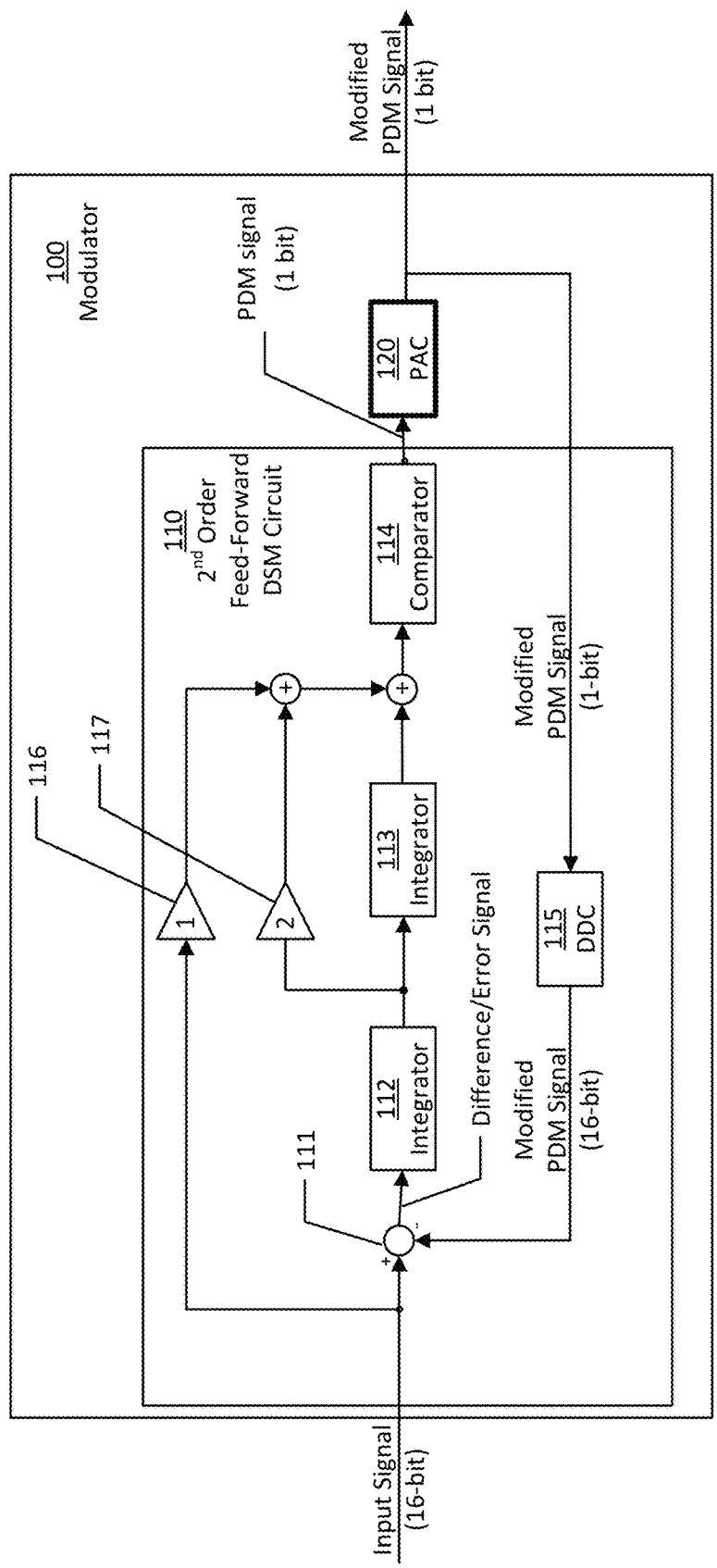
FIG. 1 illustrates a schematic diagram of a modulator in accordance with aspects of the disclosure.

FIG. 1 illustrates a schematic diagram of a modulator 100 in accordance with aspects of the disclosure.

The modulator 100 comprises a second order full feedforward Delta-Sigma Modulator (DSM) circuit 110 and a Pad Asymmetric Compensation (PAC) circuit 120.

The DSM circuit 110 may be any DSM having an order greater than one (i.e., second order, third order, etc.), and is configured to modulate an input signal into a Pulse Density Modulated (PDM) signal. The order of the DSM circuit 110 is defined by its number of integrators. The DSM circuit 110 comprises a subtractor 111, an integration circuit 112 and 113, a comparator 114, a Digital-to-Digital Converter (DDC) 115, a first multiplication factor 116, and a second multiplication factor 117.

The subtractor 111 is configured to subtract a modified PDM signal, received from the DDC 115, from the input signal, and output a difference/error signal. The input signal in this example is a 16-bit input signal, though the disclosure is not limited in this respect.

The integration circuit comprises a plurality of integrators, in this case, first stage integrator 112 and second stage integrator 113. The integration circuit is configured to accumulate the difference/error signal from the subtractor 111 on the first stage integrator 112 and subsequently on the second stage integrator 113. The integrator circuit acts as a LPF for the input signal, and as a high-pass filter for the feedback signal. The integration circuit outputs an integration signal that is proportional to the difference/error signal over a predetermined period of time.

The comparator 114 is configured to compare a summation of the integration signal and the intermediate/internal signals multiplied with the multiplication factors 116 and 117 to a certain threshold, and output the PDM signal, which in this example is a single-bit signal comprising one or more logic 0 s and/or 1 s.

The DDC 115 is coupled in the feedback path between an output of the PAC circuit 120 and the subtractor 111. The DDC 115 is configured to convert the modified PDM signal from a single-bit signal back to a multi-bit signal, in this case a 16-bit signal.

The PAC circuit 120 is configured to linearize a relation between a magnitude of the input signal and a number of rise and fall transitions/edges of the PDM signal by maximizing the number of rise and fall transitions. This linearized relation is used for compensating for any voltage offset in the demodulated PDM signal due to I/O pad asymmetry by multiplying the input signal, the PDM signal, or its demodulated signal with a linear factor based on the linearized relation. The PAC circuit 120 outputs this modified PDM signal.

The voltage offset generated after demodulation of the PDM signal is a function of the number of rise and fall edges in the PDM signal. If the output PDM signal is always a 1, the PDM signal will not have any edges; the effect of the asymmetry will be negligible in this case because there are no edges, and thus no rise time and fall time asymmetries. The greater the number of edges, the greater the asymmetry effect, and the greater the voltage offset.

The increase in number of edges does increase the overall voltage offset after demodulation. However, the increase makes the voltage offset easier to compensate. The voltage offset can be compensated by multiplying the input signal, the PDM output signal, or its demodulated signal with a linearity factor corresponding with the linear relationship.

Figures 2, 4:
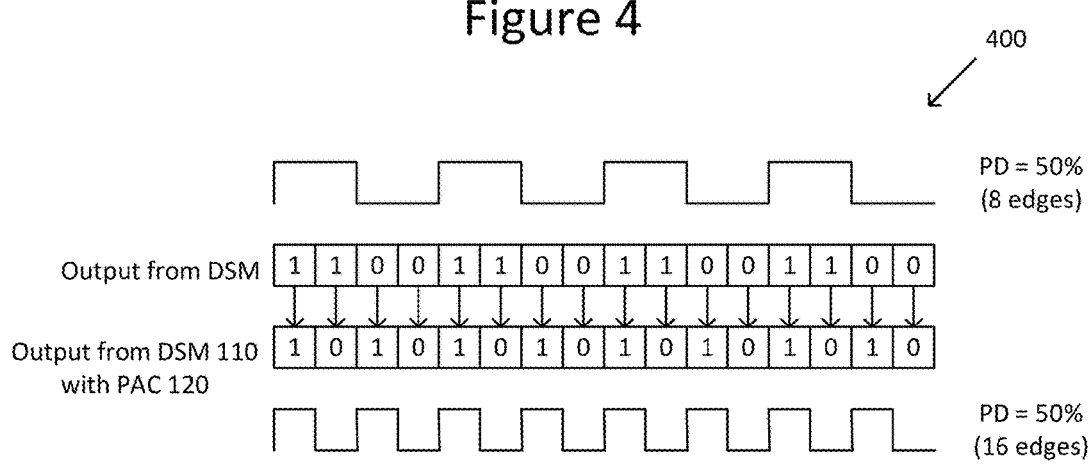
FIG. 2 illustrates a table of input signal magnitudes, output signal bit streams, and pulse-densities of a Delta-Sigma Modulator (DSM) of FIG. 1.
FIG. 4 illustrates a graph of output bit streams of a conventional DSM and a DSM with PAC logic in accordance with aspects of the disclosure.

FIG. 2 illustrates a table 200 of input signal magnitudes, output signal bit streams, and pulse-densities of the DSM 110 of FIG. 1.

The output bit streams of the DSM 110 have pulse densities based on the input signal magnitudes. For a full scale input signal, the output is all logic 1s. For a half of full scale input signal, the numbers of logic 0 s and logic 1s are equal.

Considering a scenario where the full scale value of the input signal of DSM 110 is $2^{16}$ (65,536), when there is an input signal of 0, there is a pulse density of 0%. When there is an input signal of $2^{14}$, there is a pulse density of 25%, that is, 25% of the bits are 1s and 75% of the bits are 0s. An input signal of $2^{14}$ does not mean an absolute input of $2^{14}$, but $2^{14}$ divided by the full scale value of $2^{16}$ (i.e., $2^{14}/2^{16}$, which is ¼ or 25%). Similarly, an input signal of $2^{15}$ has a pulse density of $2^{15}/2^{16}$, which is ½ or 50%.

FIG. 3 illustrates a flowchart 300 of a method performed by the Pad Asymmetric Compensation (PAC) circuit 120 in accordance with aspects of the disclosure. FIG. 4 illustrates a graph 400 of output bit streams of a conventional DSM and of the DSM 110 with PAC circuit 120.

By way of overview, the PAC circuit 120 is configured to establish a linear relationship between the input signal magnitudes and the number of rise and fall transitions/edges of the PDM output signal by maximizing the number of transitions/edges in the PDM output signal. This maximization is accomplished by the PAC circuit 120 avoiding two consecutive logic 1s as an output signal for an input signal that is less than a predetermined percentage of full scale (e.g., $2^{15}$, which is 50%) by replacing a current bit with a 0 (11→01). Similarly, the PAC circuit 120 avoids two consecutive logic 0s as output signal for an input signal that is greater than or equal to the predetermined percentage of the full scale by replacing the current bit with a logic 1 (00→10). The predetermined percentage of full scale may be 50%, for example, though the disclosure is not limited in this respect.

Stepping through the flowchart 300 for a more detailed description, at Step 310, the PAC circuit 120 is enabled by setting a PAC enable bit (pac_en) to logic 1. Of course the disclosure is not limited to this particular design; the PAC circuit 120 may be enabled in any manner.

At Step 320, if the current value of the input signal is less than a predetermined percentage of full scale, the PAC flip bit (pfb) is set to logic 1, for example. On the other hand, if the current value of the input signal is greater than or equal to the predetermined percentage of full scale, the pfb is set to logic 0, for example. The predetermined percentage may be 50%, though the disclosure is not limited in this respect.

At Step 330, it is determined whether the PAC flip bit (pfb) is equal to both a previous bit (pb) and a current bit (cb) of the PDM signal from the DSM circuit 110. The current bit (cb) is memorized as previous bit (pb) for the next sample/bit generation.

If the PAC flip bit (pfb) is equal to both the previous bit (pb) and the current bit (cb) of the PDM signal from the DSM circuit 110 (Step 360), the PAC circuit 120 outputs an inverse of the current bit ($\overline{cb}$) (Step 370).

On the other hand, if the PAC flip bit (pfb) is not equal to both the previous bit and the current bit of the PDM signal from the DSM circuit 110 (Step 340), the PAC circuit 120 outputs the current bit (cb) (Step 350).

At Step 380, the process may loop back to Step 310.

The PAC circuit 120 is further configured to feed back the modified PDM signal into the DSM circuit 110 such that the pulse density of the modified PDM signal is no different than the pulse density of the unmodified PDM signal. As shown in FIG. 4, the conventional DSM has a PDM output signal having eight edges and a pulse density of 50%. The DSM circuit 110 with PAC circuit 120 has a PDM output signal with sixteen edges, and yet maintains the pulse density of 50%. The pulse density is defined by a number of 1s relative to 0s. The pulse density does not vary, irrespective of the order of the modulator. Only distribution changes. For example, the bit stream could be 111000 or 101010, in either case the pulse density is the same.

FIG. 5 illustrates graph 500 of number of edges/transitions versus input magnitude for a conventional DSM and for the DSM circuit 110 with the PAC circuit 120 in accordance with aspects of the disclosure.

With respect to the DSM circuit 110 with the PAC circuit 120, as the input signal magnitude increases up to half of full scale, the number of edges increases linearly, and then decreases linearly thereafter, as indicated by curve 520. This is because the PAC flip bit (pfb) controls the transition between an input signal magnitude that is less than half of full scale to more than or equal to half of full scale. For a 16-bit signal, half of full scale is $2^{15}$. For a 32-bit input signal, half of full scale is $2^{31}$. The disclosure can be modified to for any input signal bit width. Without the PAC circuit 120 and the PAC fil bit (pfb), there is a nonlinear voltage offset, as indicated by curve 510.

Again, there is a relation between the magnitude of the input signal and a number of transitions in the PDM signal. By establishing a linear relation, it is possible to compensate for the I/O pad asymmetries by multiplying the input signal, the PDM signal, or its demodulated signal with a gain factor.

Without any I/O pad asymmetry, that is, signal rise and fall times are the same, then:

$$IM = \frac{TS}{TP} * NRE * FS, \text{ when } IM < 0.5 * FS, \quad \text{(Equation 1)}$$

and $$IM = \left(1 - \frac{TS}{TP} * NFE\right) * FS, \text{ when } IM \geq 0.5 * FS, \quad \text{(Equation 2)}$$

where IM is Input signal Magnitude, NRE is Number of Rising Edges, NFE is Number of Falling Edges, TS is clock period, TP is time of observation, and FS is Full Scale value.

When there is I/O pad asymmetry, that is, signal rise and fall times are not equal, then:

$$IM = \frac{TS}{TP} * NRE * FS(1 + \Delta), \text{ when } IM < 0.5 * FS, \quad \text{(Equation 3)}$$

and $$IM = \left(1 - \frac{TS}{TP} * NFE\right) * FS(1 + \Delta), \text{ when } IM \geq 0.5 * FS, \quad \text{(Equation 4)}$$

where $\Delta$ is an asymmetric factor. $\Delta$ could be positive or negative. If the relation between IM and NRE/NFE is made linear, then the gain factor $(1+\Delta)$ may be compensated as $\Delta$ is almost constant for Process Voltage Temperature (PVT).

Further, to establish a linear relationship between the magnitudes of the input signal and the number of rise and fall edges in the PDM output signal:

Number of Edges=(Linear Factor)(Input Signal) (Equation 5)

The voltage offset generated after demodulation of the PDM output signal is a function of the number of rise and fall edges in the PDM output signal as follows:

Voltage Offset=(Number of Edges)(Asymmetric Factor), and (Equation 6)

Voltage Offset=(Linear Factor)(Input Signal)(Asymmetric Factor) (Equation 7)

The linear factor is constant. The asymmetric factor has a small dependency on Process Voltage Temperature (PVT).

By way of example, when an input signal of 100 mV is multiplied by a linear factor of 100, from Equation 5 there are 10,000 edges ($10^4$). If the asymmetric factor is calculated to be 1 nV ($10^{-9}$), from Equation 6, the voltage offset is ($10^4$)($10^{-9}$)=$10^{-5}$ V (10 μV). The voltage of the output signal is the expected output voltage plus the offset voltage. So for an input signal of 100, the output voltage is ideally supposed to be 100 mV, but there is an offset of 10 μV, so the output voltage is 100 mV plus 10 μV. Since the linear factor is constant irrespective of the input signal, the input signal factoring in the offset voltage can be predicted. If the desired output voltage is 100 mV, then the input signal can be set at approximately 99.99 mV, and with the offset voltage of 10 μV, the output voltage is 100 mV.

Training can be performed on a single IC to determine asymmetry. The IC designer can define the linear relationship and compensate for the asymmetry.

Figure 6:
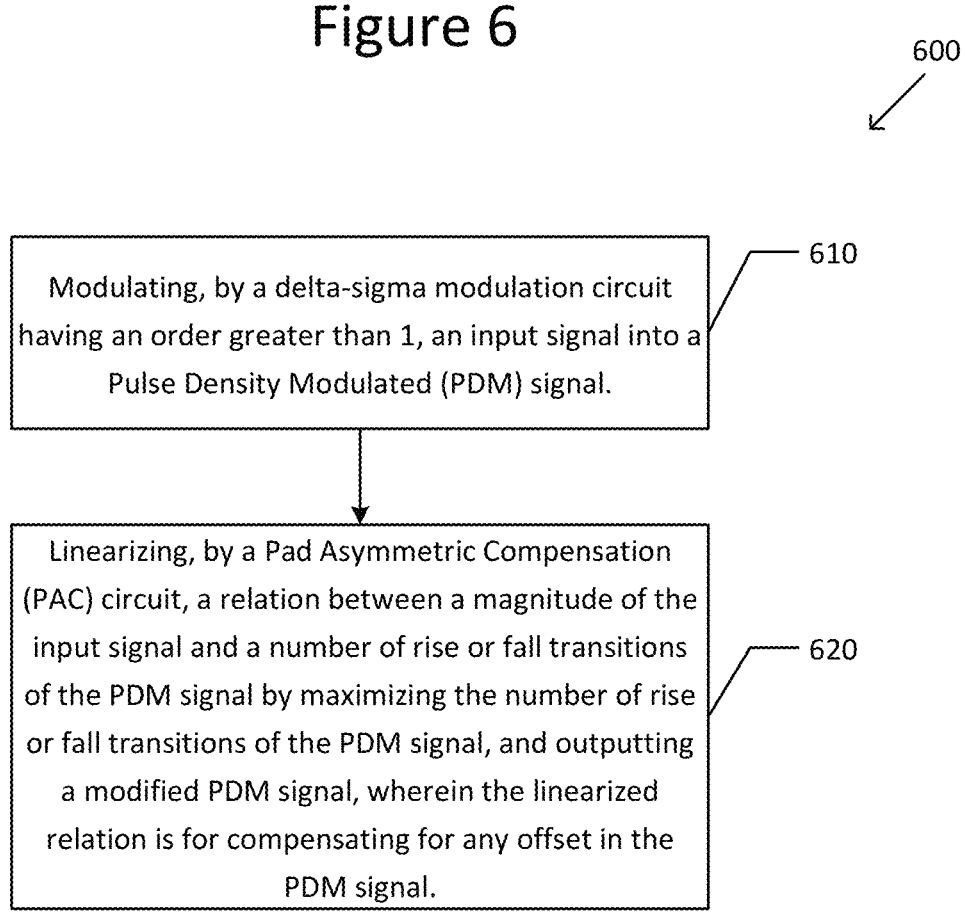
FIG. 6 illustrates a flowchart of a modulating method in accordance with aspects of the disclosure.
Figure 7:
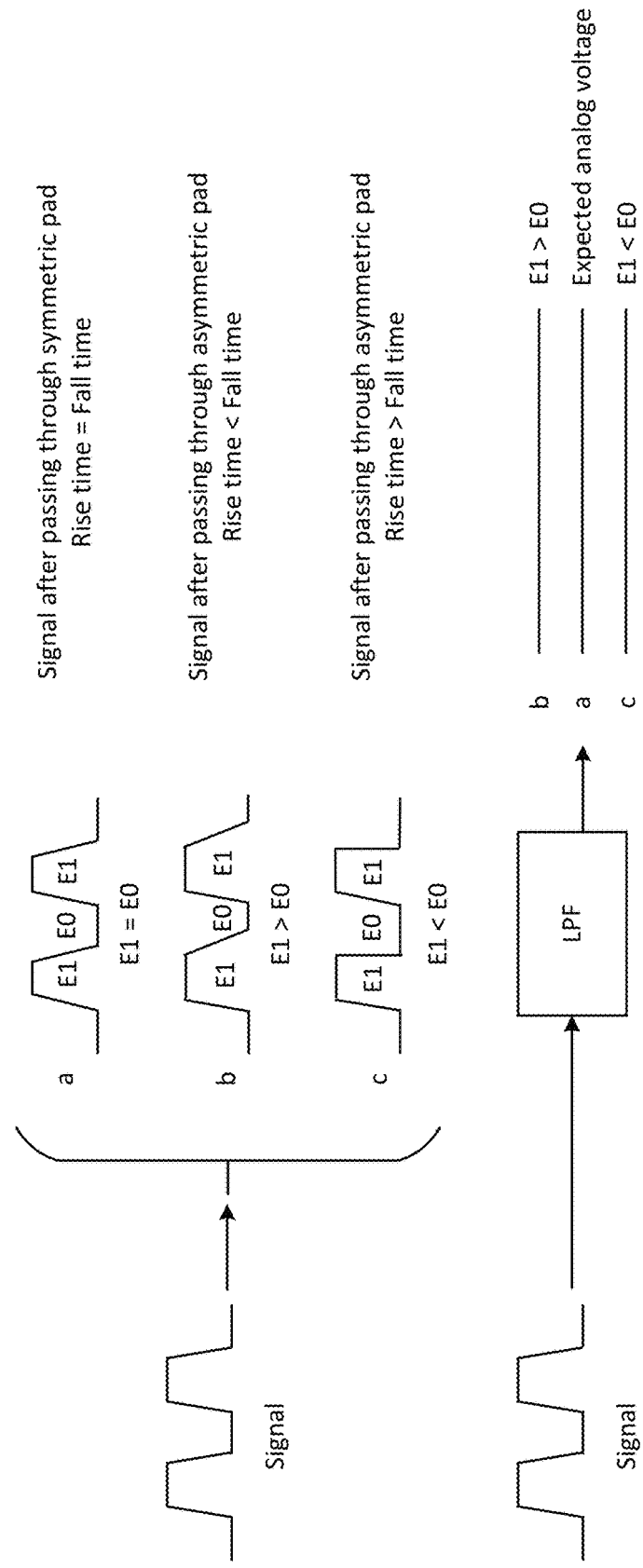
FIG. 7 illustrates an output bit stream of a conventional DSM demodulated into an analog voltage using a Low Pass Filter (LPF).

FIG. 6 illustrates a flowchart 600 of a modulating method in accordance with aspects of the disclosure.

In Step 610, the delta-sigma modulation circuit 110 having an order greater than 1 modulates an input signal into a Pulse Density Modulated (PDM) signal.

In Step 620, the Pad Asymmetric Compensation (PAC) circuit 120 linearizes a relation between a magnitude of the input signal and a number of rise or fall transitions of the PDM signal by maximizing the number of rise or fall transitions of the PDM signal, and outputting a modified PDM signal. The linearized relation is for compensating for any offset in the PDM signal.

For the purposes of this discussion, the term "circuitry" shall be understood to be circuit(s), processor(s), logic, or a combination thereof. For example, a circuit can include an analog circuit, a digital circuit, state machine logic, other structural electronic hardware, or a combination thereof.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A modulator, comprising:
   a delta-sigma modulation circuit having an order greater than 1, and configured to modulate an input signal into a Pulse Density Modulated (PDM) signal; and
   a Pad Asymmetric Compensation (PAC) circuit configured to linearize a relation between a magnitude of the input signal and a number of rise or fall transitions of the PDM signal by maximizing the number of rise or fall transitions of the PDM signal, and to output a modified PDM signal,
   wherein the linearized relation is for compensating for any offset in the PDM signal.

2. The modulator of claim 1, wherein the PAC circuit is configured to feed back the modified PDM signal into the delta-sigma modulation circuit such that the pulse density of the modified PDM signal is no different than the pulse density of the unmodified PDM signal.

3. The modulator of claim 1, wherein the PAC circuit is configured to maximize the number of rise or fall transitions of the PDM signal by:
   if the input signal is less than a predetermined percentage of full scale, replacing any two consecutive 1 bits of PDM signal with a 0 and a 1; and
   if the input signal is greater than or equal to the predetermined percentage of full scale, replacing any two consecutive 0 bits of the PDM signal with a 1 and a 0.

4. The modulator of claim 3, wherein the predetermined percentage is 50%.

5. The modulator of claim 1, wherein the PAC circuit is configured to maximize the number of rise or fall transitions of the PDM signal by:
   comparing previous and current bits of the PDM signal from the delta-sigma modulation circuit;
   if the input signal is less than a predetermined percentage of full scale, and if the previous and current bit, of the PDM signal are both 1, replacing the current bit with a 0; and
   if the input signal is greater than or equal to the predetermined percentage of full scale, and if the previous and current bits of the PDM signal are both 0, replacing the current bit with a 1.

6. The modulator of claim 5, wherein the predetermined percentage is 50%.

7. The modulator of claim 1, wherein the PAC circuit is configured to maximize the number of rise or fall transitions of the PDM signal by:
   setting a PAC flip bit to 1 if the input signal is less than a predetermined percentage of full scale, and to 0 if the input signal is greater than or equal to the predetermined percentage of full scale;
   determining whether the PAC flip bit is equal to both a previous bit and a current bit of the PDM signal from the delta-sigma modulation circuit;
   if the PAC flip bit is equal to both the previous bit and the current bit of the PDM signal from the delta-sigma modulation circuit, outputting an inverse of the current bit; and
   if the PAC flip bit is not equal to both the previous bit and the current bit of the PDM signal from the delta-sigma modulation circuit, outputting the current bit.

8. The modulator of claim 7, wherein the predetermined percentage is 50%.

9. The modulator of claim 1, wherein the delta-sigma modulation circuit comprises:

a subtractor configured to subtract the modified PDM signal from the input signal, and to output a difference or error signal;

an integration circuit comprising a plurality of integrators, and configured to output an integration signal that is proportional to the subtraction signal over a predetermined period; and a comparator configured to compare the integration signal with a threshold, and output the PDM signal.

10. The modulator of claim 1, wherein the delta-sigma modulation circuit further comprises:

a digital-to-digital converter coupled between the comparator and the subtractor, and configured to convert the PDM signal from a single-bit signal to a multi-bit signal.

11. The modulator of claim 1, wherein any offset in the PDM signal is compensated for by multiplying the input signal with a linearity factor based on the linearized relation.

12. The modulator of claim 1, wherein any offset in the PDM signal is compensated for by multiplying the PDM signal or its demodulated signal with a linearity factor based on the linearized relation.

13. A modulating method, comprising:

modulating, by a delta-sigma modulation circuit having an order greater than 1, an input signal into a Pulse Density Modulated (PDM) signal; and linearizing, by a Pad Asymmetric Compensation (PAC) circuit, a relation between a magnitude of the input signal and a number of rise or fall transitions of the PDM signal by maximizing the number of rise or fall transitions of the PDM signal, and to output a modified PDM signal, wherein the linearized relation is for compensating for any offset in the PDM signal.

14. The modulating method of claim 13, further comprising feeding back, from an output of the PAC circuit, the modified PDM signal into the delta-sigma modulation circuit such that the pulse density of the modified PDM signal is not different from the pulse density of the unmodified PDM signal.

15. The modulating method of claim 13, further comprising:

maximizing, by the PAC circuit, the number of rise or fall transitions of the PDM signal by:

if the input signal is less than a predetermined percentage of full scale, replacing any two consecutive 1 bits of PDM signal with a 0 and a 1; and if the input signal is greater than or equal to the predetermined percentage of full scale, replacing any two consecutive 0 bits of the PDM signal with a 1 and a 0.

16. The modulating method of claim 13, further comprising:

maximizing, by the PAC circuit, the number of rise or fall transitions of the PDM signal by:

comparing previous and current bits of the PDM signal from the delta-sigma modulation circuit;

if the input signal is less than a predetermined percentage of full scale, and if the previous and current bit of the PDM signal are both a 1, replacing the current bit with a 0; and if the input signal is greater than or equal to the predetermined percentage of full scale, and if the previous and current bit of the PDM signal are both a 0, replacing the current bit with a 1.

17. The modulating method of claim 13, further comprising:

maximizing, by the PAC circuit, the number of rise or fall transitions of the PDM signal by:

setting a PAC flip bit to 1 if the input signal is less than a predetermined percentage of full scale, and to 0 if the input signal is greater than or equal to the predetermined percentage of full scale;

determining whether the PAC flip bit is equal to both a previous bit and a current bit of the PDM signal from the delta-sigma modulation circuit;

if the PAC flip bit is equal to both the previous bit and the current bit of the PDM signal from the delta-sigma modulation circuit, outputting an inverse of the current bit; and if the PAC flip bit is not equal to both the previous bit and the current bit of the PDM signal from the delta-sigma modulation circuit, outputting the current bit.

18. The modulating method of claim 13, wherein the modulating comprises:

subtracting, by a subtractor, the modified PDM signal from the input signal, and outputting a difference or error signal;

generating, by an integration circuit comprising a plurality of integrators, an integration signal that is proportional to the subtraction signal over a predetermined period; and comparing, by a comparator, the integration signal with a threshold, and outputting the PDM signal.

19. The modulating method of claim 13, wherein the modulating comprises:

converting, by a digital-to-digital converter coupled between the comparator and the subtractor, the PDM signal from a single-bit signal to a multi-bit signal.

20. The modulating method of claim 13, further comprising:

compensating for any offset in the PDM signal by multiplying the input signal or the PDM signal or its demodulated signal with a linearity factor based on the linearized relation.

* * * * *